United States Patent [19]

Kondo et al.

[11] Patent Number: 5,536,361
[45] Date of Patent: Jul. 16, 1996

[54] PROCESS FOR PREPARING SEMICONDUCTOR SUBSTRATE BY BONDING TO A METALLIC SURFACE

[75] Inventors: Shigeki Kondo, Hiratsuka; Shigeyuki Matsumoto; Akira Ishizaki, both of Atsugi; Shunsuke Inoue, Yokohama; Yoshio Nakamura, Atsugi, all of Japan

[73] Assignee: Canon Kabushiki Kaisha, Tokyo, Japan

[21] Appl. No.: 376,373

[22] Filed: Jan. 23, 1995

Related U.S. Application Data

[63] Continuation of Ser. No. 202,686, Feb. 25, 1994, abandoned, which is a continuation of Ser. No. 10,872, Jan. 29, 1993, abandoned.

[30] Foreign Application Priority Data

Jan. 31, 1992 [JP] Japan ................................. 4-041947

[51] Int. Cl.$^6$ ............................................ H01L 21/306
[52] U.S. Cl. ........................ 156/630.1; 437/71; 437/974
[58] Field of Search ..................... 437/62, 71, 925, 437/966, 974; 148/DIG. 12, DIG. 135, DIG. 150; 156/630, 630.1

[56] References Cited

U.S. PATENT DOCUMENTS

| | | | |
|---|---|---|---|
| 3,929,529 | 12/1975 | Poponiak | 148/DIG. 60 |
| 4,826,787 | 5/1989 | Muto et al. | 437/247 |
| 4,983,251 | 1/1991 | Haisma et al. | 156/630 |
| 5,098,861 | 3/1992 | Blackstone | 148/DIG. 12 |
| 5,102,821 | 4/1992 | Moslehi | 437/974 |
| 5,168,078 | 12/1992 | Reisman et al. | 148/DIG. 12 |
| 5,183,769 | 2/1993 | Rutter et al. | 437/974 |
| 5,194,395 | 3/1993 | Wada | 437/62 |

OTHER PUBLICATIONS

Taka et al., "Porous silicon layers and its oxide for the silicon–on–insulator structure", J. Appl. Phys., 60(1), 1 Jul. 1986.

Cullen, "Single Crystal Silicon on Non–Single Crystal Insulators", Journ. Cryst. Growth, vol. 63, No. 3, Oct., 1983, pp. 429–590.

*Primary Examiner*—Chandra Chaudhari
*Attorney, Agent, or Firm*—Fitzpatrick, Cella, Harper & Scinto

[57] ABSTRACT

A process for preparing a semiconductor substrate comprises a step of making a silicon substrate porous, a step of forming a non-porous silicon monocrystalline layer on the resulting porous substrate, a step of bonding the surface of the non-porous silicon monocrystalline layer to another substrate having a metallic surface, and a step of removing the porous silicon layer of the bonded substrates by selective etching.

11 Claims, 7 Drawing Sheets

PROCESS FOR PREPARING SEMICONDUCTOR SUBSTRATE BY BONDING TO A METALLIC SURFACE

This application is a continuation of application Ser. No. 08/202,686 filed Feb. 25, 1994, now abandoned, which in turn, is a continuation of application Ser. No. 08/010,872, filed Jan. 29, 1993, now abandoned.

BACKGROUND OF THE INVENTION

1. Field of the Invention

The present invention relates to a process for preparing a semiconductor substrate comprising a substrate having a metallic surface or a metallic substrate, and a monocrystalline semiconductor thin film layer having outstanding crystallinity, laid thereon.

2. Related Background Art

Formation of a monocrystalline Si semiconductor layer on an insulator is widely known as a silicon-on-insulator (SOI) technique and has been extensively studied because devices based on utilization of the SOI technique have many advantages that have not been obtained in case of bulk Si substrates for preparing ordinary Si integrated circuits. That is, the following advantages can be obtained by utilizing the SOI technique:

1. Easy dielectric isolation with a possibility of higher level integration
2. Distinguished resistance to radiation
3. Reduced floating capacity with a possibility of higher speed
4. Omission of well formation step
5. Prevention of latch-up
6. Possibility to form a fully depleted field effect transistor by thin film formation, etc.

To obtain the above-mentioned many advantages of device characteristics, processes for forming the SOI structure have been studied for for at least 20 years. The results are summarized, for example, in the following literature: Special Issue: "Single-crystal silicon on non-single crystal insulators", edited by G. W. Cullen, Journal of Crystal Growth, Volume 63, No. 3, pp. 429–590 (1983).

In the past, SOS (silicon-on-sapphire) formed by heteroepitaxial growth of Si on a monocrystalline sapphire substrate by chemical vapor deposition (CVD) of Si was disclosed as a successful result of most matured SOI techniques, but its wide application was interrupted by the occurrence of many crystal defects due to lattice mismatching at the interface between the Si layer and the underlayer sapphire substrate, by diffusion of aluminum into the Si layer from the sapphire substrate, and largely by a high cost of the substrate and delay in formation of larger area.

Recently, some attempts have been made to form an SOI structure without using the sapphire substrate. The attempts can be classified into the following two major groups:

1. After the surface oxidation of a Si monocrystalline substrate, windows are made to partially expose the Si substrate, and a Si monocrystalline layer is formed on the SiO$_2$ by epitaxial growth of Si in the lateral direction, while utilizing the exposed Si substrate as seed. In this case, deposition of the Si layer on the SiO$_2$ is made.
2. A Si monocrystalline substrate itself is utilized as an active layer and SiO$_2$ is formed as its underlayer. In this case, no Si layer is deposited.

Recently, solar cells have been utilized in many fields, and solar cells of high efficiency and low cost have been in demand. Particularly since solar cells on a metallic substrate are available at a relatively low cost and can have readily a larger area, a process for forming a semiconductor layer of good crystallinity on a metallic substrate at a low cost has been desired for increasing their efficiency.

A light-transmissible substrate is important for making a contact sensor as a photo receptor element or a projection-type liquid crystal image display apparatus. A driving element of very high performance is required for making the sensor or image elements (picture elements) of the display apparatus to have a higher density, a higher resolution and a higher detail. As a result, it is necessary to use a monocrystalline layer having an outstanding crystallinity as an element to be provided on the light-transmissible substrate.

However, the SOI element utilizes an insulating substrate of low heat radiation as its underlayer, and thus has a poor heat radiation, as compared with the bulk element formed on a bulk substrate and has such problems as interruption of development of practical finer and higher speed circuits.

With finer elements, the contact size has been made finer, resulting in increasing contact resistance, or when the individual wirings are to be shielded to prevent cross-talk between the wirings, the area occupied by the wirings is increased, resulting in failure to satisfy the requirements for making the element finer.

When making a bipolar transistor which is to work at a higher speed, the current process for impurity diffusion has a limit in making a collector embedded layer which has a lower resistance, and particularly making an increase in the resistance of collectors in series connection is a serious problem.

Recently, solar cells have been utilized in many fields, and solar cells of high efficiency and low cost have been in demand. Particularly since solar cells on a metallic substrate are available at a relatively low cost and can have readily a larger area, a process for forming a semiconductor layer of good crystallinity on a metallic substrate at a low cost has been desired for increasing their efficiency.

However, in case of amorphous silicon, it is hard to increase the efficiency, and in case of Ga—As monocrystal, it is hard to reduce the cost. That is, the preparation of a solar cell of high efficiency and low cost on a metallic substrate has not been fully realized.

Generally, only an amorphous layer or at best a polycrystalline layer is formed on a light-transmissible substrate due to the randomness of its crystal structure, and a device of high performance cannot be prepared. That is, since the crystal structure of the substrate is amorphous, a monocrystalline layer of good quality cannot be obtained merely by depositing an Si layer thereon.

Furthermore, amorphous Si or polycrystalline Si has many defects in the crystal structure, and it is difficult to prepare a driving element capable of satisfying current or future requirements.

SUMMARY OF THE INVENTION

An object of the present invention is to provide a process for preparing a semiconductor substrate which has solved the foregoing problems of prior art.

Another object of the present invention is to provide a semiconductor substrate of good heat radiation capable of forming a solar cell of high efficiency at a low cost by forming a monocrystalline semiconductor thin film layer of good crystallinity on a metallic substrate at a low cost, while suppressing an increase in the contact resistance and preventing cross-talk between the wiring.

A further object of the present invention is to provide a process for preparing a semiconductor substrate, which comprises a step of making a silicon substrate porous, a step of forming a non-porous silicon monocrystalline layer on the resulting porous substrate, a step of bonding the surface of the nonporous silicon monocrystalline layer to another substrate having a metallic surface, and a step of removing the porous silicon layer of the bonded substrates by selective etching.

DETAILED DESCRIPTION OF THE PREFERRED EMBODIMENTS

Figure 1A:
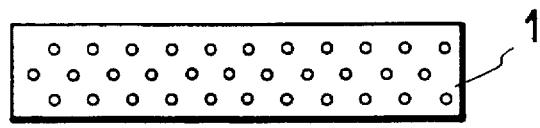
FIGS. 1A to 7C are schematic views illustrating embodiments of the present process for preparing a semiconductor substrate.
Figure 1B:
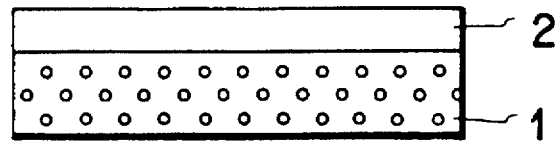

A preferable process for preparing a semiconductor substrate according to the present invention is a process for preparing a semiconductor substrate, which comprises a step of making a silicon substrate porous, a step of forming a non-porous silicon monocrystalline layer on the resulting porous substrate, a step of bonding the surface of the non-porous silicon monocrystalline layer to another substrate having a metallic surface, and a step of removing the porous silicon layer of the bonded substrates by selective etching.

In the present invention, a metallic layer or a metallic substrate having a good heat radiation is used as an underlayer for a semiconductor substrate, and thus a semiconductor substrate having a better heat radiation than that of the conventional SOI structure using an insulating substrate of poor heat radiation can be obtained.

By direct contact of a substrate having a metallic surface with a non-porous silicon monocrystalline layer acting as an active layer, a larger contact surface can be obtained than that of the conventional structure based on formation of contact holes and their connection, and an increase in the contact resistance can be prevented thereby, even if the element is made finer, and the process can be also simplified.

By forming the metallic surface as a wiring layer, and by providing shield wires between the individual wirings and the insulating layer, cross-talk can be prevented without interruption to make the element finer.

Suitable materials constituting the metallic surface for use in the present invention include, for example, Mo, Ti, Ta, Al, W or alloys containing at least one of these atoms, tungsten silicide, stainless steel, ITO, etc. Any materials can be used, in so far as they can attain the object of the present invention.

Embodiment

An Si substrate can be made porous by anodization using an HF solution.

One example of the conditions is given below. Starting materials for porous Si to be formed by the anodization are not limited to monocrystalline Si, and even Si in other crystal structure can be used.
Application voltage: 2.6 V
Current density: 30 mA·cm$^{-2}$
Anodizing solution: HF:H$_2$O:C$_2$H$_5$OH=1:1:1
Time: 2.4 hours
Thickness of porous Si: 300 μm
Porosity: 56%

The density of the porous Si layer can be changed in a range of 1.1 to 0.6 g/cm$^3$ by changing the concentration of HF solution in a range of 50 to 20%, as compared with the density of monocrystalline Si, i.e. 2.33 g/cm$^3$.

The nonporous silicon monocrystalline layer can be formed on the porous substrate by epitaxial growth.

Observation of the porous Si layer by a transmission electron microscope reveals that pores having an average diameter of about 600 Å are formed in the porous Si layer, and its density is less than one half of the monocrystalline Si, but the porous Si layer retains the monocrystallinity and thus a monocrystalline Si layer can be made to epitaxially grow on the porous Si layer.

Epitaxial growth of a non-porous silicon layer on the porous silicon layer can be made by molecular beam epitaxial growth, bias sputtering, plasma CVD, photo CVD, liquid phase growth, CVD, etc., but the procedure is not limited thereto.

The porous silicon layer can be removed by selective etching according to an electroless wet chemical etching procedure.

Selective etching of the porous Si according to the present invention will be described below.

The porous layer contains a large amount of pores inside the layer, and consequently the density is decreased to less than one half of the non-porous layer.

That is, the surface area is considerably increased, as compared with its volume, and the chemical etching rate is considerably accelerated, as compared with the etching rate of the ordinary monocrystalline layer. Thus, only the porous Si can be removed by selective etching, i.e. by electroless wet chemical etching by impregnation with such an etching solution as hydrofluoric acid (or buffered hydrofluoric acid, which will be hereinafter referred to as BHF), a mixture of hydrofluoric acid (or BHF) and hydrogen peroxide solution, a mixture of hydrofluoric acid (or BHF) and alcohol, or a mixture of hydrofluoric acid (or BHF), hydrogen peroxide solution and alcohol, where the etching solution is stirred in the absence of the alcohol or not stirred in the presence of the alcohol.

The present invention will be explained in detail, referring to Examples.

EXAMPLE 1

FIGS. 1A to 1E are schematic views showing process steps according to Example 1 of the present invention.

A p-type (100) monocrystalline Si substrate 1 having a thickness of 200 μm was anodized in a HF solution to make it porous (FIG. 1A) under the following anodizing conditions:
Application voltage: 2.6 V
Current density: 30 mA·cm$^{-2}$
Anodizing solution: HF:H$_2$O:C$_2$H$_5$OH=1:1:1
Time: 1.6 hours
Thickness of porous Si: 200 μm
Porosity: 56%

Then, an epitaxial Si monocrystalline film 2 of high quality was deposited to a thickness of 1 μm on the p-type (100) porous Si substrate (FIG. 1B) by ordinary CVD under the following deposition conditions:
Source gas: SiH$_2$Cl$_2$ 500 sccm
Carrier gas: H$_2$ 180 l/min.
Substrate temperature: 950° C.
Pressure: 80 Torr
Growth time: 3 min.

Figure 1C:
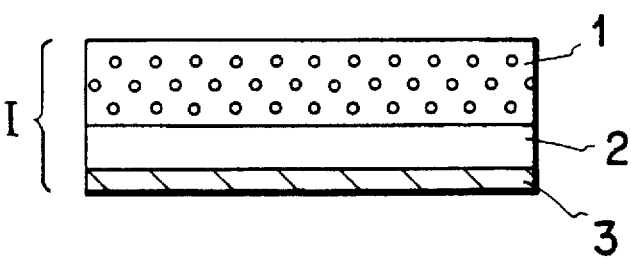

Then, an oxide layer 3 having a thickness of 500 Å was formed on the epitaxial layer 2 (FIG. 1C).

Figure 1D:
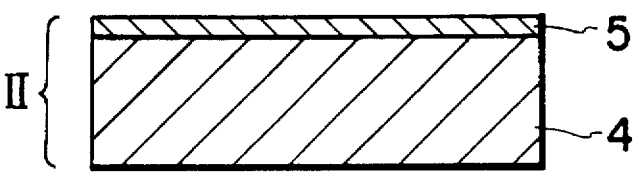

Tungsten silicide 5 as a metallic layer was formed to a thickness of 1 μm on the surface of another Si substrate 4 by sputtering (FIG. 1D).

Then, the surface of the oxide layer 3 of the substrate having the porous layer was bonded to the surface of the metallic layer 5 of the other substrate and heated in an oxygen atmosphere at 600° C. for 0.5 hours to tightly bond both Si substrates to each other.

Figure 1E:
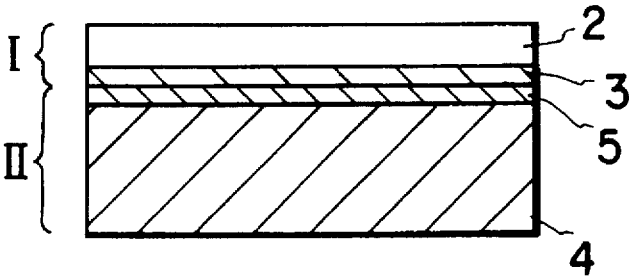

Then, the bonded substrates were selectively etched in a mixture of 49% hydrofluoric acid, alcohol and 30% hydrogen peroxide solution (10:6:50) without stirring. 65 minutes thereafter, only the non-porous silicon monocrystalline layer 2 was left without becoming etched. The porous Si substrate 1 was selectively etched and completely removed while the non-porous silicon monocrystal was utilized as an etch-stop material (FIG. 1E).

The etching rate of the non-porous Si monocrystal in the etching solution was very low, and was less than 50 Å even in 65 minutes. That is, selectivity of the etching rate to the porous layer was more than $10^5$ of that to the non-porous layer, and the decrease in the thickness of the non-porous silicon monocrystalline layer by etching (a few tens Å) was practically negligible.

That is, the porous Si substrate 1 having a thickness of 200 μm was removed, whereby the silicon monocrystalline layer 2 of good crystallinity was formed on the substrate 4 having the metallic layer 5 through $SiO_2$ 3.

EXAMPLE 2

Figure 2A:
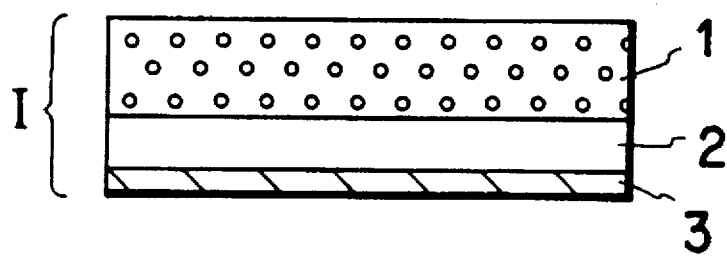
Figure 2B:
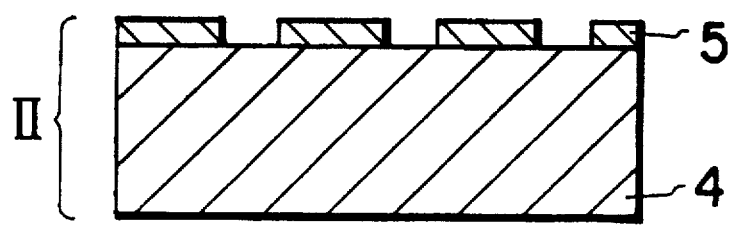
Figure 2C:
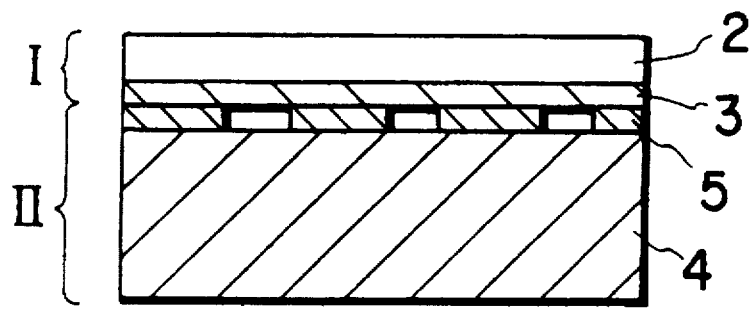

FIGS. 2A to 2C are schematic views showing process steps according to Example 2 of the present invention.

A p-type (100) monocrystalline Si substrate 1 having a thickness of 200 μm was anodized in a HF solution to make it porous under the same anodizing conditions as in Example 1.

Then, a non-porous silicon monocrystalline epitaxial layer 2 was made to grow at a low temperature to a thickness of 0.1 μm on the p-type (100) porous Si substrate by MBE (molecular beam epitaxy) under the following conditions:
Temperature: 700° C.
Pressure: $1 \times 10^{-9}$ Torr
Growth rate: 0.1 nm/sec Then, an oxide layer 3 having a thickness of 500 Å was formed on the surface of the epitaxial layer 2 (FIG. 2A).

Tungsten silicide 5 as a metallic layer was formed to a thickness of 1 μm on the surface of another Si substrate 4 by sputtering and further patterned to form a desired wiring pattern (FIG. 2B).

Then, these two substrates were laid on each other and heated in an oxygen atmosphere at 700° C. for 0.5 hour, whereby these two Si substrates were firmly bonded to each other.

Then, the bonded substrates were selectively etched in a mixture of buffered hydrofluoric acid (an aqueous solution of 36% ammonium fluoride and 4.5% hydrofluoric acid), alcohol and 30% hydrogen peroxide solution (10:6:50) without stirring. 205 minutes thereafter, only the non-porous silicon monocrystalline layer was left without becoming etched. The porous Si substrate was selectively etched and completely removed while the non-porous silicon monocrystal was utilized as an etch-stop material.

That is, the porous Si substrate having a thickness of 200 μm was removed, whereby the silicon monocrystalline layer 2 of good crystallinity was formed on the substrate 4 having the metallic layer 5 formed in the desired wiring pattern through $SiO_2$ 3. (FIG. 2C).

EXAMPLE 3

Figure 3A:
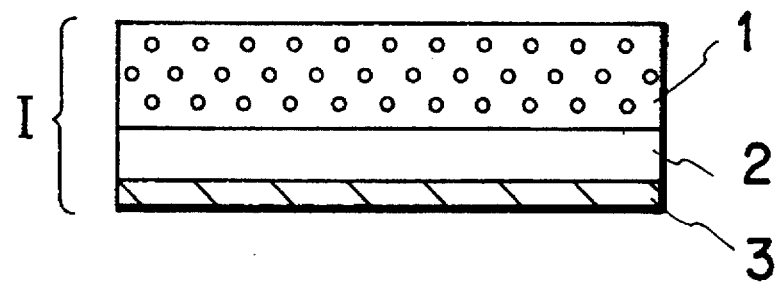
Figure 3B:
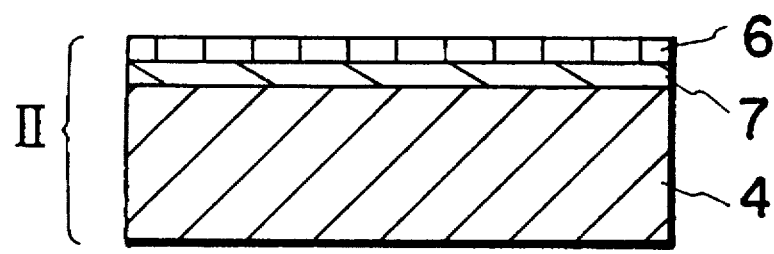
Figure 3C:
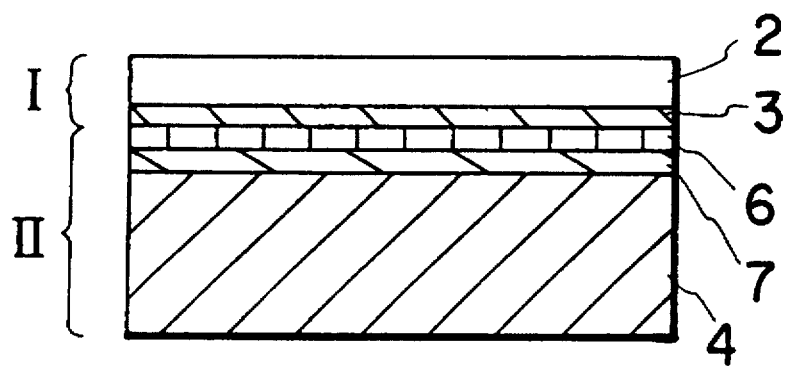

FIGS. 3A to 3C are schematic views showing process steps according to Example 3 of the present invention.

A p-type (100) monocrystalline Si substrate 1 having a thickness of 200 μm was anodized in a HF solution to make it porous under the same anodizing conditions as in Example 1.

Then, an Si epitaxial layer 2 was made to grow at a low temperature to a thickness of 0.1 μm on the p-type (100) porous Si substrate 1 by plasma CVD under the following deposition conditions:
Gas: $SiH_4$
High frequency power: 100 W
Temperature: 800° C.
Pressure: $1 \times 10^{-2}$ Torr
Growth rate: 2.5 nm/sec Then, an oxide layer ($SiO_2$) 3 having a thickness of 500 Å was formed on the surface of the non-porous silicon epitaxial layer 2 by thermal CVD (FIG. 3A).

Aluminum (Al) 7 as a metallic layer was formed to a thickness of 1 μm on the surface of another Si substrate 4 by sputtering, and $Al_2O_3$ 6 was further formed by anodization (FIG. 3B).

Then, these two substrates were laid on each other and heated in an oxygen atmosphere at 450° C. for 0.5 hour, whereby both Si substrates were firmly bonded to each other.

Then, the bonded substrates were selectively etched in a mixture of 49% hydrofluoric acid and 30% hydrogen peroxide solution (1:5) with stirring. 62 minutes thereafter, only the non-porous silicon monocrystalline layer was left without becoming etched. The porous Si substrate 1 was selectively etched and completely removed while the non-porous silicon monocrystal was utilized as an etch-stop material.

That is, the porous Si substrate having a thickness of 200 μm was removed, whereby the silicon monocrystalline layer 2 of good crystallinity was formed on the substrate 4 having the metallic layer (Al) 7 through the insulating layer ($Al_2O_3$) 6.

EXAMPLE 4

Figure 4A:
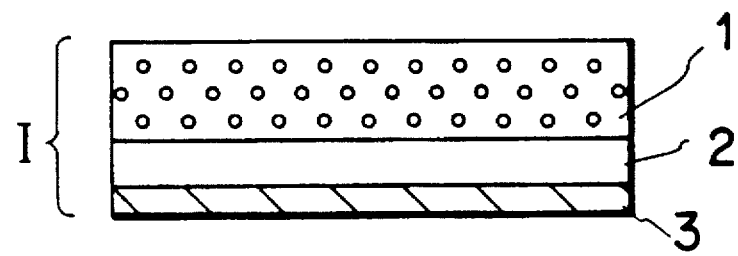
Figure 4B:
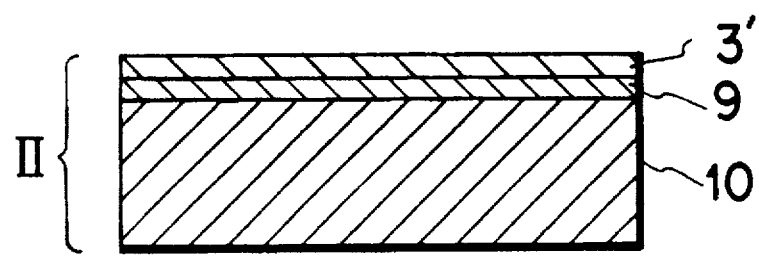
Figure 4C:
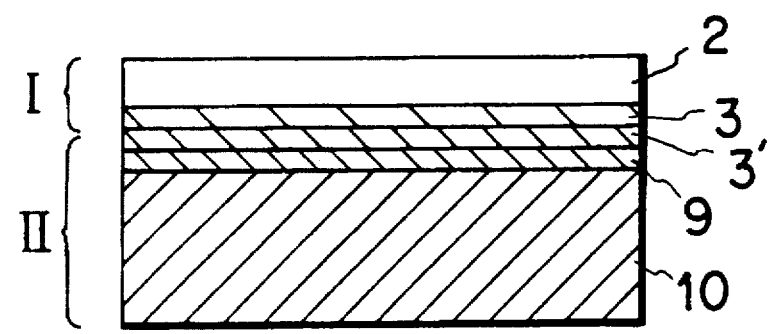

FIGS. 4A to 4C are schematic views showing process steps according to Example 4 of the present invention.

A p-type (100) monocrystalline Si substrate 1 having a thickness of 200 μm was anodized in a 50% HF solution at a current density of 100 mA/cm$^2$ and a porous formation rate of 8.4 μm/min. to make it porous. 24 minutes thereafter the p-type (100) Si substrate 1 having a thickness of 200 μm was entirely made porous.

Then, an epitaxial Si monocrystalline film 2 was deposited to a thickness of 1 μm on the p-type (100) porous Si substrate by ordinary CVD under the following deposition conditions:
Source gas: $SiH_2Cl_2$ 500 sccm
Carrier gas: $H_2$ 180 l/min.
Substrate temperature: 950° C.
Pressure: 80 Torr
Growth time: 3 min.

Then, an oxide layer 3 having a thickness of 500 Å was formed on the non-porous silicon monocrystalline epitaxial layer 2 by thermal CVD (FIG. 4A).

ITO 9 as a metallic layer was formed to a thickness of 1,000 Å on the surface of another optically polished fused silica glass substrate 10 by sputtering and furthermore $SiO_2$ 3' was formed thereon by sputtering (FIG. 4B).

Then, these two substrates were laid on each other and heated in an oxygen atmosphere at 400° C. for 0.5 hours.

Then, $Si_3N_4$ was deposited thereon to a thickness of 0.1 μm by plasma CVD to coat the bonded two substrates therewith, and only the nitride film on the porous layer was removed by reactive ion etching.

Then, the bonded substrates were selectively etched in a mixture of 49% hydrofluoric acid, alcohol and 30% hydrogen peroxide solution (10:6:50) without stirring. 65 minutes thereafter, only the non-porous silicon monocrystalline layer 2 was left without becoming etched. The porous Si substrate 1 was selectively etched and completely removed while the monocrystalline Si 2 was utilized as an etch-stop material.

That is, the porous Si substrate having a thickness of 200 μm was removed, whereby the silicon monocrystalline layer 2 of good crystallinity could be formed on the transparent substrate 10 having the transparent electroconductive film (ITO) 9 through $SiO_2$ 3 (FIG. 4C).

In case of coating with Apiezon wax or Electron wax in place of the $Si_3N_4$ layer, similar effects could be obtained, and only the porous Si substrate was completely removed.

EXAMPLE 5

Figure 5A:
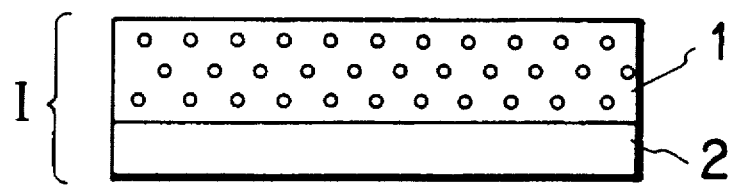
Figure 5B:
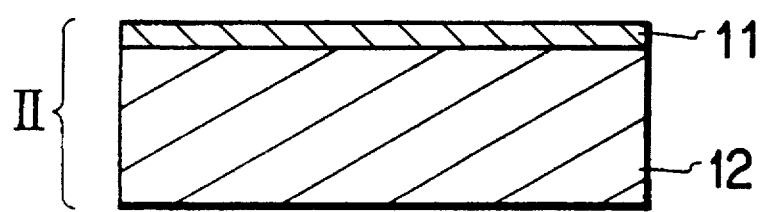
Figure 5C:
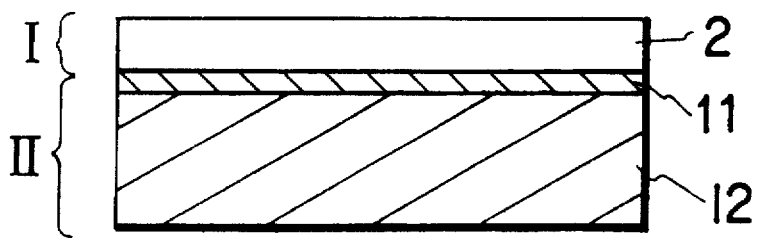

FIGS. 5A to 5C are schematic views showing process steps according to Example 5 of the present invention.

A p-type (100) monocrystalline Si substrate 1 having a thickness of 200 μm was anodized in a HF solution to make it porous under the same anodizing conditions as in Example 1.

An Si epitaxial layer 2 was made to grow at a low temperature to a thickness of 0.1 μm on the p-type (100) porous Si substrate 1 by bias sputtering (which will be hereinafter referred to as BS process) under the following deposition conditions (FIG. 5A):

Surface Cleaning Conditions
Temperature: 350° C.
Atmosphere: Ar
Pressure: 15 mTorr
Substrate potential: 10 V
Target potential: −5 V
High frequency power: 5 W
RF frequency: 100 MHz
Plasma potential: 12 V
Deposition Conditions
RF frequency: 100 MHz
High frequency power: 100 W
Temperature: 350° C.
Ar gas pressure: 15 mTorr
Growth time: 5 min.
Film thickness: 0.1 μm
Target DC potential: −150 V
Substrate DC potential: +20 V
Plasma potential: 39 V Then, a polysilicon layer 11 of low resistivity was formed on the surface of another stainless steel substrate 12 by vacuum CVD (FIG. 5B). The polysilicon layer of low resistivity was omitted.

Then, these two substrates were laid on each other, and heated in a nitrogen atmosphere at 900° C. for 0.5 hour to firmly bond both substrates to each other.

Then, the bonded substrates were selectively etched in a mixture of 49% hydrofluoric acid and alcohol (10:1) without stirring. 82 minutes thereafter, only the non-porous silicon monocrystalline layer was left without becoming etched. The porous Si substrate 1 was selectively etched and completely removed while the monocrystalline Si was utilized as an etch-stop material (FIG. 5C).

That is, the porous Si substrate having a thickness of 200 μm was removed, whereby the silicon monocrystalline layer 2 of Good crystallinity was formed on the metallic substrate (stainless steel) 12 (FIG. 5C).

EXAMPLE 6

Figure 6A:
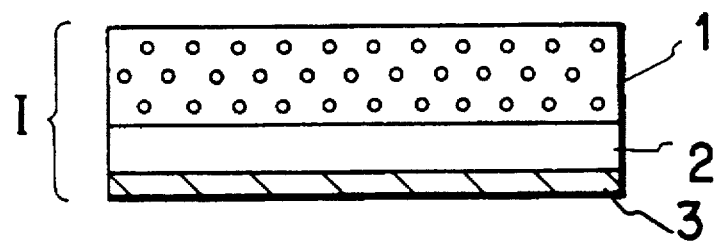
Figure 6B:
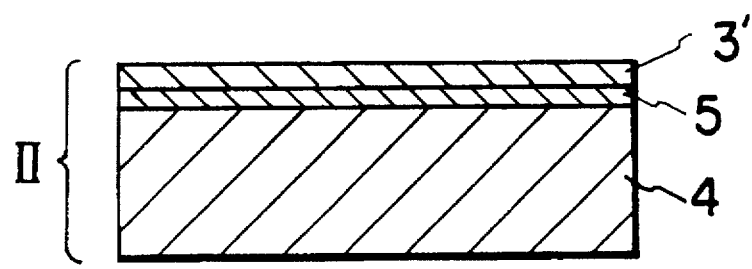
Figure 6C:
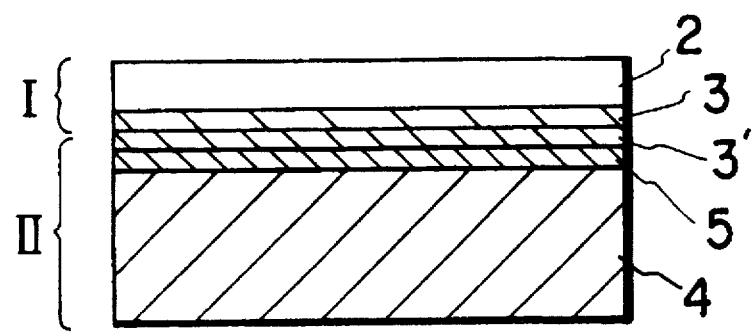

FIGS. 6A to 6C are schematic views showing process steps according to Example 6 of the present invention.

A p-type (100) monocrystalline Si substrate 1 having a thickness of 200 μm was anodized in a HF solution to make it porous under the same anodizing conditions as in Example 1.

Then, a non-porous silicon monocrystalline epitaxial layer 2 was made to grow at a low temperature to a thickness of 0.1 μm on the p-type (100) porous Si substrate by MBE (molecular beam epitaxy) under the following deposition conditions:

Temperature: 700° C.
Pressure: $1 \times 10^{-9}$ Torr
Growth rate: 0.1 nm/sec

Then, an oxide layer 3 having a thickness of 500 Å was formed on the epitaxial layer (FIG. 6A).

Tungsten silicide 5 as a metallic layer was formed to a thickness of 1 μm on the surface of another Si substrate 4 by sputtering and furthermore an $SiO_2$ layer 3' was formed to a thickness of 1 μm by CVD (FIG. 6B).

Then, these two substrates were laid on each other and heated in an oxygen atmosphere at 700° C. for 0.5 hour to firmly bond both Si substrates to each other.

Then, the bonded substrates were selectively etched in a mixture of buffered hydrofluoric acid (an aqueous solution of 36% ammonium fluoride and 4.5% hydrofluoric acid), alcohol and 30% hydrogen peroxide solution (10:6:50) without stirring. 205 minutes thereafter, only the non-porous silicon monocrystalline layer 2 was left without becoming etched. The porous Si substrate 1 was selectively etched and completely removed while utilizing the non-porous silicon monocrystal was utilized 2 as an etch-stop material.

That is, the porous Si substrate 1 having a thickness of 200 μm was removed, whereby silicon monocrystalline layer 2 of good crystallinity was formed on the substrate 4 having the metallic layer 5 through insulating layers $SiO_2$ 3 and 3' (FIG. 6C).

EXAMPLE 7

Figure 7A:
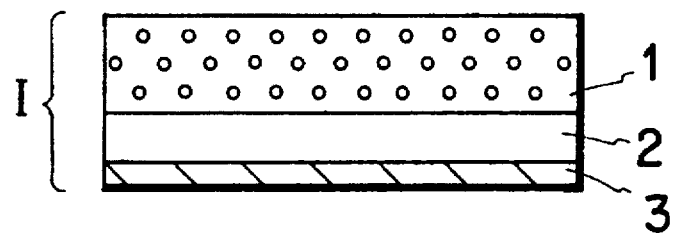
Figure 7B:
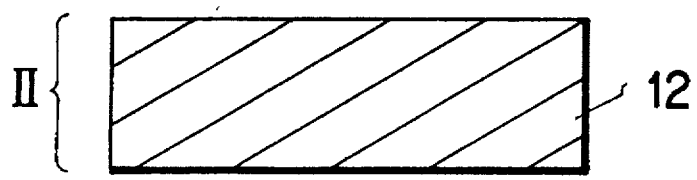
Figure 7C:
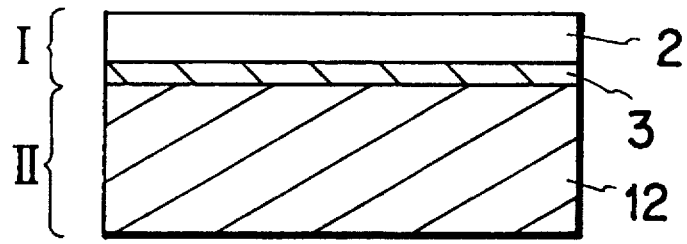

FIGS. 7A to 7C are schematic views showing process steps according to Example 7 of the present invention.

A p-type (100) monocrystalline Si substrate 1 having a thickness of 200 μm was anodized in a HF solution to make it porous under the same anodizing conditions as in Example 1.

Then, a non-porous silicon monocrystalline epitaxial layer 2 was made to grow at a low temperature to a thickness of 0.1 μm on the p-type (100) porous Si substrate by MBE (molecular beam epitaxy) under the following deposition conditions:

Temperature: 700° C.
Pressure: $1 \times 10^{-9}$ Torr
Growth rate: 0.1 nm/sec

Then, an oxide layer 3 having a thickness of 500 Å was formed on the epitaxial layer 2 (FIG. 7A).

Next, there was provided another stainless steel substrate 12 (FIG. 7B).

Then, these two substrates were laid on each other and heated in a nitrogen atmosphere at 700° C. for 0.5 hour to firmly bond both substrates to each other.

Then, the bonded substrates were selectively etched in a mixture of buffered hydrofluoric acid (an aqueous solution of 36% ammonium fluoride and 4.5% hydrofluoric acid), alcohol and 30% hydrogen peroxide solution (10:6:50) without stirring. 205 minutes thereafter, only the non-porous silicon monocrystalline layer was left without becoming etched. The porous Si substrate was selectively etched and completely removed while the non-porous silicon monocrystal was utilized as an etch-stop material.

That is, the porous Si substrate having a thickness of 200 µm was removed, whereby the silicon monocrystalline layer 2 of good crystallinity was formed on the metallic substrate 12 through the insulating layer $SiO_2$ 3 (FIG. 7C).

EXAMPLE 8

An example of direct bonding of a metallic layer to an epitaxial layer without an insulating layer as an intermediate layer will be explained in this Example 8.

An epitaxial layer was made to grow on a porous Si substrate by CVD under the following conditions:
Source gas: $SiH_2Cl$ 500 sccm
Carrier gas: $H_2$ 180 l/min.
Substrate temperature: 950° C.
Pressure: 80 Torr
Growth time: 3 min.

A thermally oxidized film was formed to a thickness of 5,000 Å on the surface of another Si substrate and then tungsten was formed thereon to a thickness of 1 µm by sputtering.

Then, these two substrates were bonded to each other and heated in an $N_2$ atmosphere at 800° C. for 0.5 hour to firmly bond both substrates to each other.

When the bonding temperature was increased to about 1,000° C., the epitaxial layer and the tungsten layer underwent silicide reaction, whereby the bonding could be made more firmly.

The etching removal was carried out in the same manner as in any one of the foregoing Examples 1 to 7.

In the present invention, as described above a metallic layer or a metallic substrate having a good heat radiation is used as an underlayer for a semiconductor substrate, and thus a semiconductor substrate having a better heat radiation than that of the conventional SOI structure using an insulating substrate of poor heat radiation can be obtained. The present process permits higher speed of manufacture and permits the device to be made finer and also improves the reliability of the device.

By direct contact of a substrate having a metallic surface with a non-porous silicon monocrystalline layer acting as an active layer, a larger contact surface can be obtained than that of the conventional structure based on formation of contact holes and their connection, and an increase in the contact resistance can be prevented thereby, even if the element is made finer, and the process can be also simplified.

By forming the metallic surface as a wiring layer, and providing shield wires between the individual wirings and the insulating layer, cross-talk can be prevented without interruption to make the element finer.

Furthermore, the present invention provides a process distinguished in productivity, uniformity, controllability and economy in forming a Si crystalline thin film layer whose crystallinity is as good as the monocrystalline wafer on a light-transmissible substrate such as quartz, etc. through a metallic layer such as ITO, etc.

What is claimed is:

1. A process for preparing a semiconductor substrate, comprising, in sequence, the steps of: (i) preparing a silicon substrate having a porous silicon layer, (ii) forming a non-porous silicon monocrystalline layer on the porous silicon layer, (iii) bonding the surface of the non-porous silicon monocrystalline layer to another substrate having a metallic surface, and (iv) removing the porous silicon layer of the bonded substrates by selective etching.

2. The process according to claim 1, wherein the step of bonding to another substrate having a metallic surface is conducted by bonding the surface of the non-porous silicon monocrystalline layer to another substrate having a metallic surface through an insulating layer.

3. The process according to claim 1 or 2, further comprising a step of forming the metallic surface as a wiring layer.

4. The process according to claim 1 or 2, wherein at least a part of the metallic surface is in contact with the non-porous silicon monocrystalline layer.

5. The process according to claim 1, wherein the non-porous silicon monocrystalline layer is an epitaxial layer formed by epitaxial growth.

6. The process according to claim 1 or 2, wherein the substrate having a metallic surface is a light-transmissible substrate having a transparent electroconductive film (ITO) as a layer.

7. The process according to claim 1 or 2, wherein the substrate having a metallic surface is a support substrate having a metallic film as a layer.

8. The process according to claim 1 or 2, wherein the substrate having a metallic surface is a metallic substrate.

9. The process according to claim 1 or 2, wherein the substrate having a metallic surface is a stainless steel substrate.

10. A process for preparing a semiconductor substrate comprising, in sequence, the steps of: (i) preparing a first silicon substrate having a porous silicon layer, (ii) forming a non-porous silicon monocrystalline layer on the porous silicon layer, (iii) forming an oxide layer on the non-porous silicon monocrystalline layer, (iv) bonding the surface of the oxide layer to a second substrate having a metallic surface, and (v) removing the porous silicon layer of the bonded substrates by selective etching.

11. A process for preparing a semiconductor substrate comprising, in sequence, the steps of: (i) preparing a first silicon substrate having a porous silicon layer, (ii) forming a non-porous silicon monocrystalline layer on the porous silicon layer, (iii) forming an oxide layer on the non-porous silicon monocrystalline layer, (iv) preparing a second substrate having a metallic surface, (v) forming an insulating layer on the metallic surface, (vi) bonding the surface of the oxide layer to the insulating layer, and (vii) removing the porous silicon layer of the bonded substrates by selective etching.

* * * * *

UNITED STATES PATENT AND TRADEMARK OFFICE
CERTIFICATE OF CORRECTION

PATENT NO. : 5,536,361
DATED : July 16, 1996
INVENTOR(S) : SHIGEKI KONDO ET AL.

Page 1 of 2

It is certified that error appears in the above-indentified patent and that said Letters Patent is hereby corrected as shown below:

COLUMN 1

Line 41, "for for" should read --for--.

COLUMN 5

Line 16, "monocrystal" should read --monocrystal 2--.

COLUMN 7

Line 17, "$SiO_2$ 3" should read --$SiO_2$ 3 and 3'--.

COLUMN 8

Line 3, "Good" should read --good--.
Line 39, "utilizing" should be deleted.
Line 40, "was utilized 2" should read --2 was utilized--.

UNITED STATES PATENT AND TRADEMARK OFFICE
CERTIFICATE OF CORRECTION

PATENT NO. : 5,536,361
DATED : July 16, 1996
INVENTOR(S) : SHIGEKI KONDO ET AL.

It is certified that error appears in the above-indentified patent and that said Letters Patent is hereby corrected as shown below:

COLUMN 9

Line 24, "$SiH_2Cl$" should read --$SiH_2Cl_2$--.
Line 55, "and" (second occurrence) should be deleted.

Signed and Sealed this

Tenth Day of December, 1996

Attest:

BRUCE LEHMAN

*Attesting Officer*  *Commissioner of Patents and Trademarks*